United States Patent [19]

Komamiya et al.

[11] 4,137,569
[45] Jan. 30, 1979

[54] LOGIC CIRCUIT SYSTEM USING HIGH ELECTRIC FIELD DOMAIN

[75] Inventors: Yasuo Komamiya, Yokohama; Hiroshi Tateno; Shoei Kataoka, both of Tanashi; Morisue Mititada, Yono, all of Japan

[73] Assignee: Agency of Industrial Science & Technology, Tokyo, Japan

[21] Appl. No.: 783,025

[22] Filed: Mar. 30, 1977

[30] Foreign Application Priority Data

May 27, 1976 [JP] Japan .................................. 51-60663

[51] Int. Cl.$^2$ .............................................. G06F 7/385
[52] U.S. Cl. ........................................ 364/784; 357/1; 364/786
[58] Field of Search ................. 364/784, 786; 357/1-3

[56] References Cited

U.S. PATENT DOCUMENTS

| 3,594,618 | 7/1971 | Hartnagel et al. ........................ 357/3 |
| 3,766,372 | 10/1973 | Kataoka et al. ....................... 364/786 |

OTHER PUBLICATIONS

J. J. Chang, "Semiconductor Bulk Effect Full-Adder Circuit", *IBM Technical Disclosure Bulletin*, vol. 12, No. 1, 6-1969, pp. 6-8.

*Primary Examiner*—Jerry Smith
*Attorney, Agent, or Firm*—Oblon, Fisher, Spivak, McClelland & Maier

[57] ABSTRACT

In a high electric field domain device composed of a plurality of circuit elements each provided with a high electric field domain-generating electrode and a high electric field domain-suppressing electrode, logic operations can be performed by preparatorily applying affirmative signals and their corresponding negative signals to the suppressing electrodes of the individual circuit elements and subsequently applying pulse-coded signals of affirmations and negations to the generating electrodes of the circuit elements which have had the affirmative and corresponding negative signals applied in advance thereto.

3 Claims, 8 Drawing Figures

LOGIC CIRCUIT SYSTEM USING HIGH ELECTRIC FIELD DOMAIN

BACKGROUND OF THE INVENTION

This invention relates to a logic circuit system based on a high electric field domain and adapted to perform additions at an extremely high speed with high operational tolerance and great reliability of performance by virtue of the generation-extinction phenomenon of high electric field domain in the bulk semiconductor.

Recent electronic computers are composed preponderantly of integrated circuits using silicon elements and their operational speeds have come to exceed the order of nanoseconds (ns). A further elevation of their speed, however, is considered only remotely practicable because of physical phenomena inevitably attendant upon the injection of carriers into their component elements, ultimate limits to the technique of microscopic fabrication, and the like.

Microwave high electric field domain elements such as of GaAs enjoy a physical phenomenon called the "threshold value" effect which makes possible response times of less than 100ps and such elements further possess an amplifying function. They are, therefore, expected to make possible "threshold value" logic operations at speeds notably exceeding those obtainable with LSI's. The logic circuits which utilize such high electric field domain elements include those for logic operations such as AND, NAND and NOR and operational circuits which utilize the transverse spreading of high electric field domains. Since the conventional circuits are formed by connecting individual logic circuits in many steps, however, the circuitry and wiring of these circuits are complicated and the number of component elements used therein is frequently so large as to retard operational speeds. Further, the circuits which utilize the transverse spreading of high electric field domain have the disadvantage of low bias voltage tolerance.

The object of the present invention is to provide logic circuit system by use of a high electric field domain device, which enjoys notably improved reliability of performance, simplified circuit wiring and greatly elevated operational speed.

SUMMARY OF THE INVENTION

To accomplish the object described above according to the present invention, there is provided a logic circuit system based on a high electric field domain device comprising a plurality of circuit elements each consisting of a high electric field domain-generating electrode and a high electric field domain-suppressing electrode, wherein affirmative signals and their corresponding negative signals are preparatorily applied to the suppressing electrodes of the individual circuit elements and thereafter the pulse-coded electric signals of affirmations and negations are applied to the generating electrodes of the elements to which the affirmative signals and corresponding negative signals have been applied. Thus, no erroneous operations due to time lag can occur because suppressing signals are first applied to the suppressing electrodes and thereafter pulse-coded signals are applied to the generating electrodes. Further since the signals applied to the generating electrodes are pulse-coded signals, high electric field domains occur one at a time, indicating that erroneous operations due to simultaneous occurrence of a plurality of high electric field domains can never take place. The device provides exact and highly reliable operations because there are used two lines of circuit elements, namely one regular line and one auxiliary line which are adapted to produce mutually negating actions so that operations involving exclusive-or are performed by withdrawing signals from the two lines at mutually corresponding positions. Moreover the fact that the actions of carry are effected substantially simultaneously at all the steps not merely adds to the high-speed response of the high electric field domain elements themselves but also improves the high-speed function of the circuits as a whole.

The other objects and characteristic features of the present invention will become apparent from the description to be given in further detail hereinafter with reference to the accompanying drawings.

DESCRIPTION OF THE PREFERRED EMBODIMENT

Figure 1:
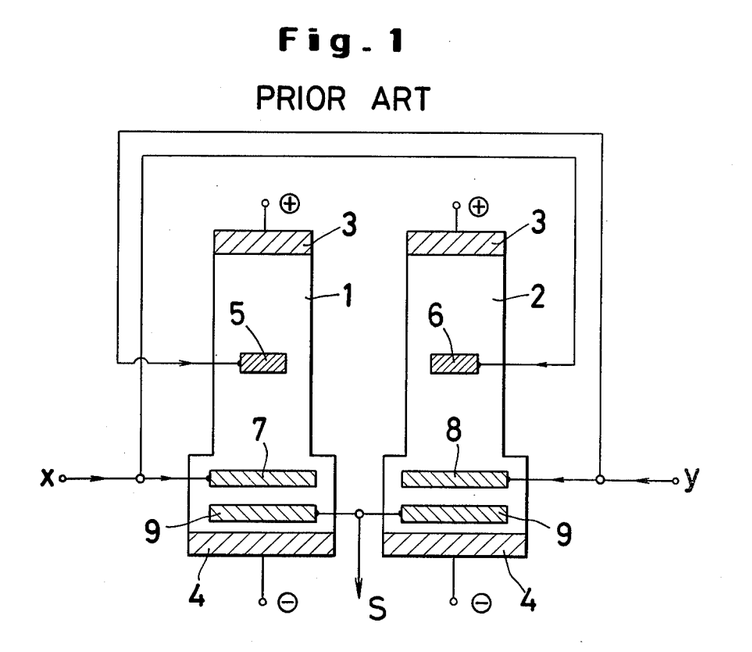
FIG. 1 is an explanatory diagram of a conventional exclusive-or device formed of two high electric field domain devices and adapted to produce actions for suppressing domains.

FIG. 1 illustrates a conventional exclusive-or circuit formed of high electric field domain devices and intended to be used as an adder. Two high electric field domain-generating elements 1 and 2 are made of GaAs or other similar substance and each incorporates an anode 3 and a cathode 4 at opposite ends, with the cathode side having a greater width than the anode side. The elements have trigger electrodes 5, 6 of a Schottky structure disposed in their respective portions of a smaller width and suppressing electrodes 7, 8 of a Schottky structure disposed in their portions of a greater width. When a minus pulse signal is applied to the trigger electrodes 5, 6, the electrons in the portions of the element directly below the electrodes pass beyond the "threshold" electric field value and generate a high electric field domain. When a minus pulse signal is applied to the suppressing electrodes 7, 8, a depletion layer spreads out in the portions of the element directly below the electrodes, with the result that the electric field of the elements 1, 2 falls below the level necessary for causing the high electric field domain to travel. Thus, no traveling high electric field domain is produced without reference to the presence or absence of signals applied to the trigger electrodes 5, 6.

In the elements 1, 2, electrodes 9 for withdrawing output signals of the elements are interposed between the suppressing electrodes 7, 8 and the respective cathodes 4. When a high electric field domain is generated in either of the two elements, the potential in the portion below the relevant electrode 9 is lowered, giving rise to an output in the form of a minus pulse-form voltage in the electrode 9.

Now the element 1 alone is considered. When in this element, the signal of x $\rightleftarrows$ 1 is applied to the suppressing electrode 7 and the signal of y $\rightleftarrows$ 0 to the trigger electrode 5, then a suppressing pulse is given to the electrode 7 and no trigger signal is given to the electrode 5. Consequently, no high electric field domain is generated and the output electrode 9 issues an output of "0". When the signals of x $\rightleftarrows$ 0 and y $\rightleftarrows$ 1 are applied, no suppressing pulse is given to the electrode 7 and a trigger signal is given only to the electrode 5. There is consequently generated a high electric field domain which travels to the cathode side, causing the output electrode 9 to issue an output of "1". When the signals of x $\rightleftarrows$ 1 and y $\rightleftarrows$ 1 are applied, a suppressing signal is given to the suppressing electrode 7 and, consequently, a depletion layer spreads out in the portion of element below the electrode 7 to weaken the electric field of the element. Thus, application of a trigger signal to the electrode 5 does not result in generation of any high electric field domain, so that the output of the output electrode 9 is "0". With one element alone, therefore, there is effected a suppressing action of $\sim$x·y.

When two elements each capable of the suppressing action are combined as shown in FIG. 1 so as to permit connection between the trigger electrode 5 of the element 1 and the suppressing electrode 8 of the element 2, between the suppressing electrode 7 of the element 1 and the trigger electrode 6 of the element 2 and between the output electrode 9 of the element 1 and the output electrode 9 of the element 2 respectively, there is obtained a circuit usable for exclusive-or operations.

When, in this circuit element, the signals of x $\rightleftarrows$ 1 and y $\rightleftarrows$ 0 are applied, then no suppressing signal is given to the electrode 8 and a signal is given to the trigger electrode 6 in the element 2 while no high electric field domain is generated in the element 1. Consequently, there is generated a high electric domain and the electrode 9 issues an output signal, giving a status of S $\rightleftarrows$ 1. Where there are applied the signals of x $\rightleftarrows$ 0 and y $\rightleftarrows$ 1, there results an action opposite the action just described, namely, a high electric field domain is generated in the element 1 while no output is caused in the element 2. Thus, the electrode 9 issues an output signal, giving a status of S $\rightleftarrows$ 1. Where there are applied the signals of x $\rightleftarrows$ 1 and y $\rightleftarrows$ 1, signals are simultaneously given to the suppressing electrodes 7, 8 of the elements 1, 2 so that no high electric field domain is generated even if signals are given to the trigger electrodes 5, 6. Thus, there results a status of S $\rightleftarrows$ 0. The device of the configuration of FIG. 1, therefore, realizes exclusive-or operations of S $\rightleftarrows$ $\sim$x·y v x·$\sim$y.

In case where this circuit element is used as a sum circuit in an adder and the symbols "x" and "y" are assumed to represent respectively a signal for carry from the preceding step and a signal for indicating the result of two exclusive-or operations in the relevant digit, the condition involving the signals of x $\rightleftarrows$ 0 and y $\rightleftarrows$ 1, namely, involving no carry from the preceding step causes a high electric field domain to occur in the element 1 and travel therefrom, giving a sum signal of "1". This turns out to be a correct logic operation. In the case of an operation involving the signals of x $\rightleftarrows$ 1 and y $\rightleftarrows$ 1, namely, involving a carry from the preceding step, the existence of a discrepancy in timing of the input signals being received in the circuits may possibly cause an erroneous operation. To be specific, if the signal of x $\rightleftarrows$ 1 indicating a carry from the preceding step lags behind the signal of y $\rightleftarrows$ 1, since the signal of y $\rightleftarrows$ 1 causes a high electric field domain to occur within the element 1 and travel thereof, the signal of x $\rightleftarrows$ 1 for carry received as an input during the travel of the domain cannot eliminate the high electric field domain. Also in the case of an operation involving the signals of x $\rightleftarrows$ 1 and y $\rightleftarrows$ 1, the output electrode issues a signal "1" and gives rise to a status of 1 + ① = 1. Thus, no correct exclusive-or operation is attained.

Further owing to the fact that an affirmative signal "x" for a carry from the preceding step and the corresponding negative signal "$-$x" are used for generation of a high electric field domain, an operation involving the status $\sim$x $\rightleftarrows$ 1 fails to bring about a carry signal in one case and a status $\sim$x $\rightleftarrows$ 1 occurs at all times in the absence of a signal without reference to the operation in another case, possibly causing an erroneous operation. Where the signal x $\rightleftarrows$ 1 continues to exist for a long time, the high electric field domain is alternately generated and extinguished, possibly causing an erroneous operation.

Figure 2:
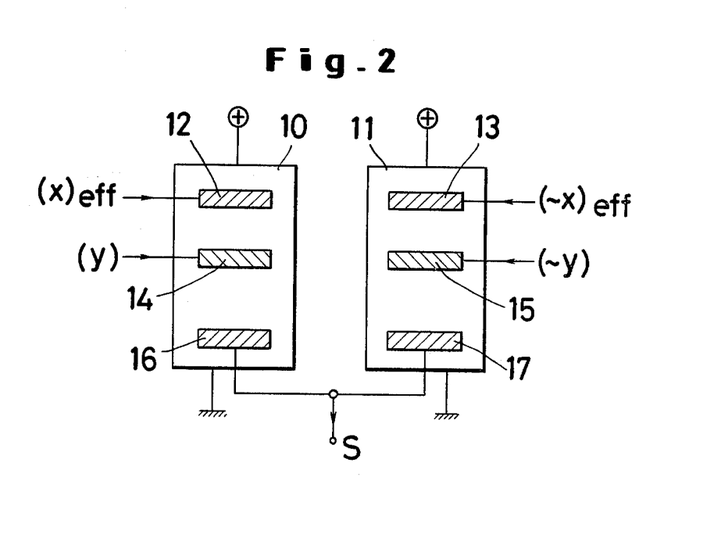
FIG. 2 is a diagram showing the operating principle of the high electric field domain device system for performing exclusive-or operations by use of the phenomenon of high electric field domains according to the present invention.

FIG. 2 is a diagram showing the principle of an exclusive-or circuit operation materialized by preparatorily applying a signal to the suppressing electrode of the high electric field domain and further using effective affirmative and negative signals as trigger signals to overcome the disadvantage of the conventional logical sum circuit.

With reference to FIG. 2, two elements 10, 11 capable of generating high electric field domains are provided respectively with trigger electrodes 12, 13, suppressing electrodes 14, 15 and output electrodes 16, 17.

In the circuit elements mentioned above, suppressing signals y and $\sim$y are applied preparatorily to the suppressing electrodes 14, 15. Then with a lag of prescribed length, an effective affirmative signal $(x)_{eff}$ and the corresponding negative signal $(\sim x)_{eff}$ are applied to the trigger electrodes 12, 13.

The effective affirmative signal $(x)_{eff}$ and the effective negative signal $(\sim x)_{eff}$ mentioned above will now be described with reference to FIG. 3.

Figure 3:
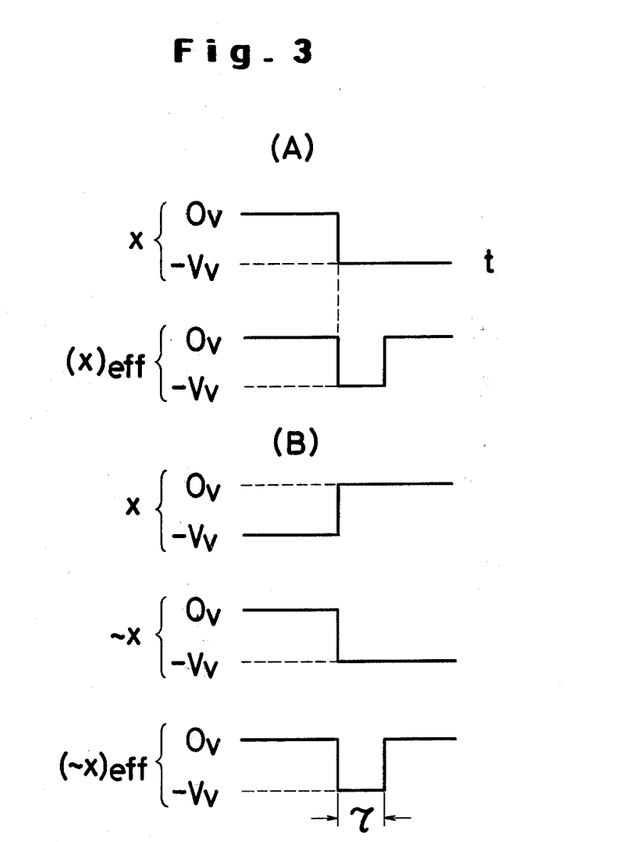
FIG. 3 is an explanatory diagram showing effective affirmative and negative signals to be used in the system of the present invention.

Now, assume that the values of the voltage of the signals corresponding to "0" and "1" of the binary numeral x are 0v and $-$Vv, and the voltages corresponding to "0" and "1" of x will be represented by the upper part of the diagram of FIG. 3(A). In the diagram, the horizontal axis represents the time course. To represent the effective numerals of x by the symbol $(x)_{eff}$, the signal of x assumes a pulse-coded value indicated in the lower part of the diagram of FIG. 3(A). Thus, there is produced a signal wherein the period during which the truth value is "1" occurs for a certain short interval and just once. If the effective negation is represented by the symbol of $(\sim x)_{\it eff}$, then the corresponding signal is as indicated in FIG. 3(B). This means that when the signal of x is represented by the pattern of the upper part of the diagram of FIG. 3(B), the corresponding negative signal $\sim x$ has the pattern indicated in the middle part of the diagram of FIG. 3(B). The effective negative signal $(\sim x)_{\it eff}$, thus, provides a logic function such that the voltage $-Vv$ corresponding to the truth value "1" exists for a fixed, short period such as, for example, $\tau$sec. and the voltage 0v exists for the remaining period. Such effective affirmative and effective negative signals as these are produced by subjecting to differentiation the signals x and $\sim x$ shown in FIG. 3, for example. It is evident that the outputs of the high electric field domain assume the forms of effective affirmation and effective negation.

When the suppressing signal y is applied to the suppressing electrode 14 of the first element 10 and the suppressing signal $\sim y$ to the suppressing electrode 15 of the second element 11 and thereafter the effective affirmative signal $(x)_{\it eff}$ and the corresponding effective negative signal $(\sim x)_{\it eff}$, both of pulse-coded pattern, are applied to their respective trigger electrodes 12, 13 as described above, an operation involving the stata of $x \rightleftarrows 1$ and $y \rightleftarrows 1$ results in application of a signal of $(x)_{\it eff} \rightleftarrows y$ to the trigger electrode 12 of the element 10, suggesting that no consideration need be given to the timing. Further, since the signal $(x)_{\it eff}$ is converted into a pulse-coded pattern, the signal $(x)_{\it eff}$ vanishes before the high electric field domain generated by the signal of $(x)_{\it eff} \rightleftarrows 1$ reaches the anode of the element even where there exist the stata $x \rightleftarrows 1$ and $y \rightleftarrows 0$. Consequently, it never happens that the high electric field domain will be absorbed by the anode and thereafter generated again by the trigger electrode.

Actually in the construction of a sum circuit in the adder, for example, a circuit enjoying high reliability of performance and perfect freedom from erroneous operation can be formed by preparatorily giving to the suppressing electrodes the signals indicating the results of the two exclusive-or operations performed at a given digit and subsequently giving to the trigger electrodes the signals of effective affirmation and corresponding negation as to the status of carry from the preceding step.

By using as the output signal the logical sum derived from the output electrodes 16, 17 of the two elements 10, 11, there can be obtained an exclusive-or operation, the output S being as indicated in the formula (1) below, $$S \rightleftarrows (x)_{\it eff} \cdot \sim y \vee (\sim x)_{\it eff} \cdot y \tag{1}$$

Generally when two input signals are x and y, the output S' of the exclusive-or is expressed by the following formula.

$$S' = x \cdot \sim y \vee \sim x \cdot y$$

In case where an exclusive-or circuit is formed of a gun effect element by using the effective signal for the signal x in the foregoing formula, the signal S representing the effective exclusive-or is obtained as the output by applying to the suppressing electrodes 14, 15 the signals y and $\sim y$ produced in advance and then giving, as trigger signals, the effective affirmative signal $(x)_{\it eff}$ to the electrode 12 and the effective negative signal $(\sim x)_{\it eff}$ to the electrode 13 respectively.

Figure 4:
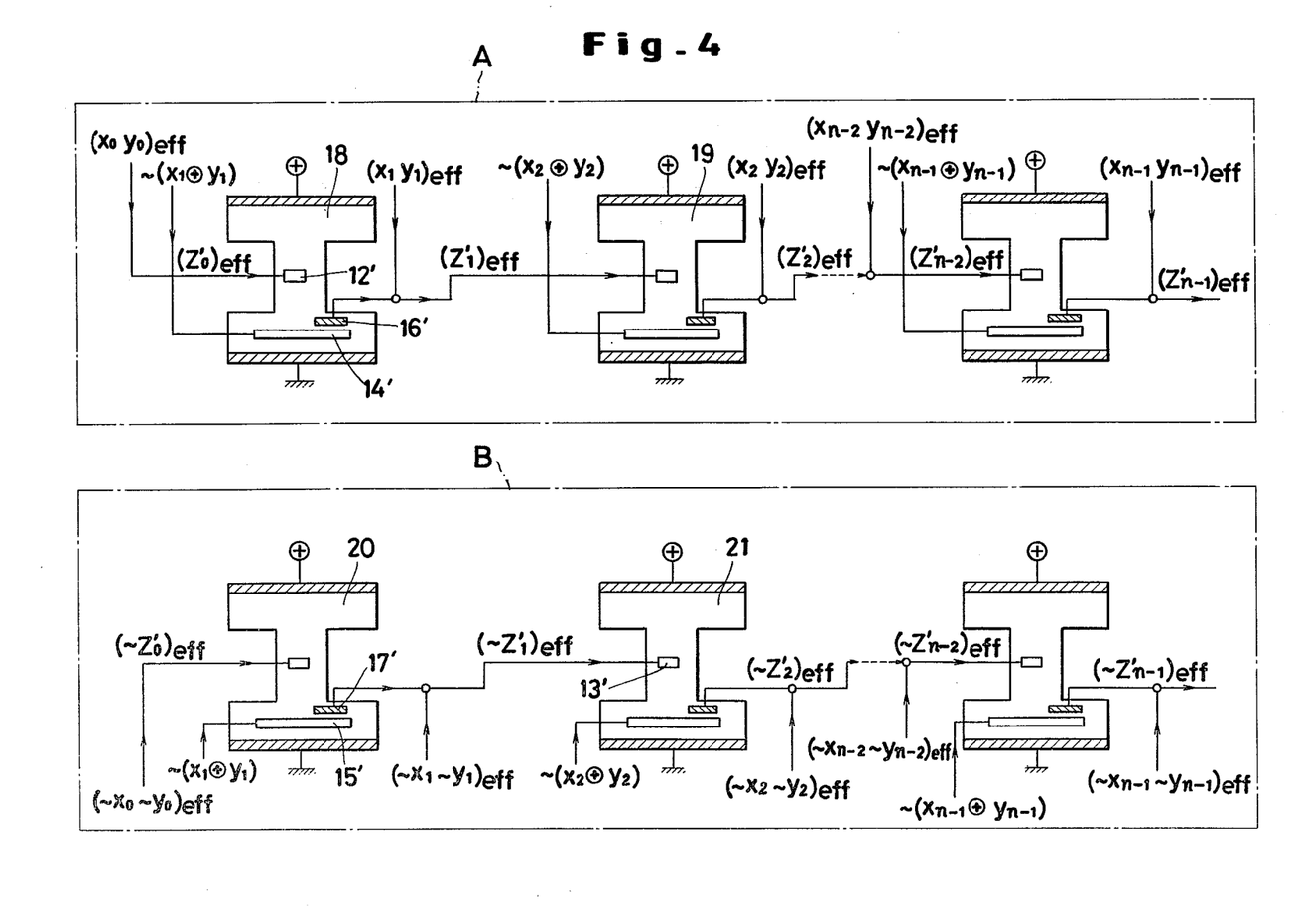
FIG. 4 is a diagram showing the operating principle of the high-speed carry circuit system to be effected by the high electric field domain device according to the present invention.

FIG. 4 is a diagram showing the operating principle of the high-speed carry circuit device of two (one regular and one auxiliary) lines of mutually negating function to be effected by the high electric field domain elements, wherein circuit A is for generating an effective signal of carry by the principle of ball rolling and circuit B for generating an effective negative signal of carry.

Each of the elements which compose a circuit is possessed of a high electric field zone and a low electric field zone. A trigger electrode 12' is disposed in said high electric field zone and a suppressing electrode 14' and an output electrode 16' are disposed in the low electric field zone.

It is now assumed that the two binary numerals in the adder are X and Y and that they are represented as follows.

$$X = x_{n-1} \cdot 2^{n-1} + x_{n-2} \cdot 2^{n-2} + \ldots + x \cdot 2 + x_0$$
$$Y = y_{n-1} \cdot 2^{n-1} + y_{n-2} \cdot 2^{n-2} + \ldots + y_1 \cdot 2 + y_0 \tag{2}$$

It is further assumed that the signal of carry from the digit $2^i$ to the digit $2^{i+1}$ is $Z'_i$ and the signal of sum in the digit $2^i$ is $Z_i$. Then, the equation of the formula (3) is satisfied.

$$x_i + y_i + Z'_{i-1} \rightleftarrows Z'_i \cdot 2 + Z_i \tag{3}$$

Therefore, the sum signals $Z_i$, $Z'_i$, and $\sim Z'_i$, are represented as shown in the formulas (4) and (5).

$$Z_i \rightleftarrows x_i \oplus y_i \oplus Z'_{i-1} \rightleftarrows (x_i \oplus y_i) \cdot \sim Z'_{i-1} \vee \sim (x_i \oplus y_i) \cdot Z'_{i-1} \tag{4}$$

$$Z'_i \rightleftarrows x_i y_i \oplus y_i Z'_{i-1} \oplus Z'_{i-1} \cdot x_i \rightleftarrows x_i y_i \vee Z'_{i-1}(x_i \oplus y_i) \tag{5}$$

Negation of the formula (5) gives an expression of the formula (6).

$$\sim Z'_i \rightleftarrows \sim x_i y_i \vee \sim Z'_{i-1} \cdot (x_i \oplus y_i) \tag{6}$$

It is now assumed that in the circuit element A of FIG. 4, the signals in the least significant digit are $x_0$ and $y_0$. If, in this case, the effective signal $(x_0 y_0)_{\it eff}$ of the logical product (AND) $x_0 \cdot y_0$ is applied to the trigger electrode 12' of the first element 18 and the signal $(x_1 \oplus y_1)$ is applied in advance to the suppressing electrode 14', an operation involving a status $x_1 \oplus y_1 \rightleftarrows 1$ generates a high electric field domain in the element 18 and derives a logic signal "1" from the output electrode 16', effecting the action $(x_0 \cdot y_0) \cdot (x_1 \oplus y_1)$ of the second term in the right member of the formula (5). Further, the logical sum of this output signal and the signal $(x_1 \cdot y_1)_{\it eff}$ is converted into the signal $(Z'_i)_{\it eff}$ of carry to the next more significant digit and applied to the trigger electrode of the second element 19. In this case, the stata $(x_0 \cdot y_0) \cdot (x_1 \oplus y_1) \rightleftarrows 1$ or 0 and $(x_{i-1} \cdot y_{i-1}) \cdot (x_1 \oplus y_1) \rightleftarrows 1$ or 0 rely on each other. Generally, the status $(x_i \cdot y_i)_{\it eff} \rightleftarrows 0$ or 1 hold good where the status $(x_{i-1} \cdot y_{i-1}) \cdot (x_1 + y_1) \rightleftarrows 1$ or 0 is satisfied.

Here, the signal $(x_1 y_1)_{\it eff}$ serves as a trigger signal for the second element 19 and has no effect on the trigger signal to be received as the input to the first element 18. This is because the output electrode 16' of the first element is of a Schottky type and the portion thereof constitutes to the zone for the electric field function, so that the application of the signal $(x_1y_1)_{eff}$ to the output electrode neither result in generation of any high electric field domain in the element 18 nor gives little change of voltage to the trigger electrode. Similarly in the subsequent operation, the trigger signal has substantially no effect upon the preceding element when it is applied to the element of the preceding step, giving birth to a unidirectional carry circuit.

In the second element 19, the signal $\sim(x_2 \oplus y_2)$ is applied in advance to the suppressing electrode and then the signal $(Z'_1)_{eff}$ resulting from the carry from the preceding step is applied as an input to the trigger electrode. Consequently, the action of generation or suppression of a high electric field domain is effected within the element similarly to the first element 18 and the pulse-coded signal of the logical sum of the resulting output signal and the effective signal $(x_2y_2)_{eff}$ is forwarded to the trigger electrode of the subsequent step.

According to the system of the present invention, there can be realized a carry circuit which has a smaller number of component elements and a notably simpler wiring than the conventional system and, what is more, enjoys ample tolerance in the bias voltage and high reliability of performance.

In FIG. 4, circuit B is for generating an effective negative signal for the signal of carry. The arithmetic operation of the second term in the right member of the equation of the formula (6) is carried out when the signal $(\sim x_0 \cdot \sim y_0)$ is applied in advance to the trigger electrode 15' of the first element 20 in which the negative signal $\sim(x_1 \oplus y_1)$ has already been applied to the suppressing electrode. The output signal from the outlet electrode 17' is subjected in conjunction with the effective signal $(\sim x_1 \sim y_1)_{eff}$ to a logical sum operation and the resulting signal is applied to the trigger electrode 13' of the element 21 of the subsequent step. A similar operation is then carried out to give rise to an effective negative signal for the signal of carry. As will be touched upon below, the output $(Z'_i)_{eff}$ of each step of the circuits A and B is applied in conjunction with the signal $(\sim Z'_i)_{eff}$ to the exclusive-or circuit.

Figure 5:
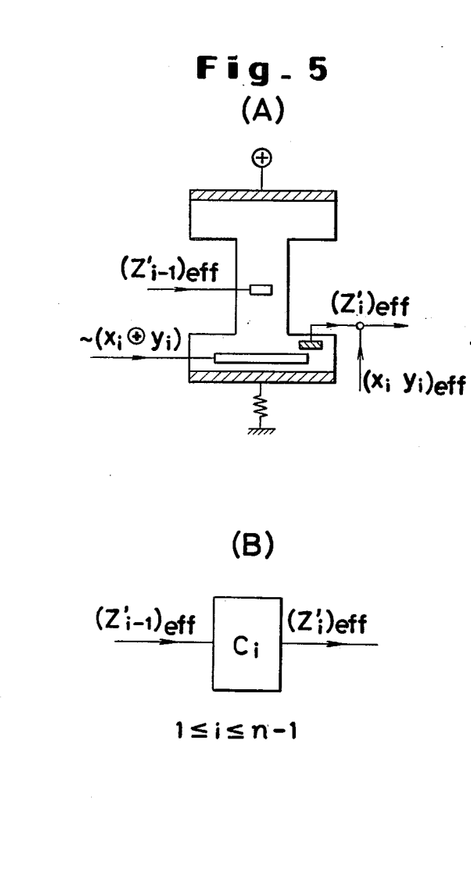
FIG. 5 is a diagram showing an effective circuit formed in accordance with the operating principle of FIG. 4 and adapted to produce an affirmative signal of carry and a schematic representation of the circuit.
Figure 6:
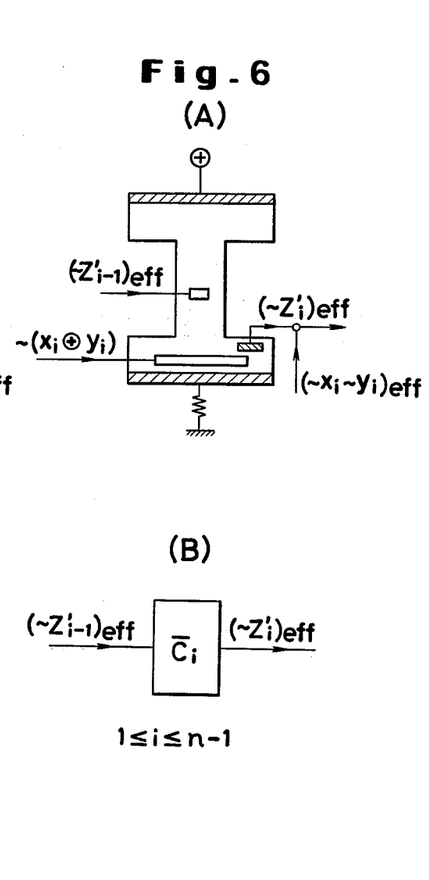
FIG. 6 is a diagram showing an effective circuit adapted to produce a negative signal of carry corresponding to the affirmative signal in the circuit of FIG. 5 and a schematic representation of the circuit.
Figure 7:
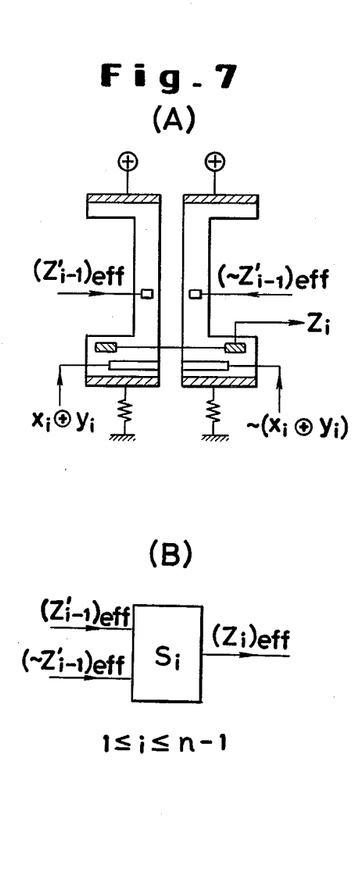
FIG. 7 is a diagram showing a circuit formed in accordance with the operating principle of FIG. 2 and used for performing exclusive-or operations and a schematic representation of the circuit.

FIGS. 5–7 represent varying adder circuits each formed by using two (one regular and one auxiliary) mutually negating lines of unidirectional high-speed carry circuits in accordance with the logic circuit system according to the present invention and their respective schematic diagrams.

FIG. 5(A) represents a one-digit carry circuit for generating a carry for the effective affirmative signal. In this diagram, $(Z'_{i-1})$ denotes a signal of the carry from the preceding step and $(Z'_i)_{eff}$ denotes a carry signal for the i'th digit. This generation of $(Z'_i)_{eff}$ is based on the principle explained with reference to FIG. 4. FIG. 5(B) is a schematic diagram indicating the circuit of FIG. 5(A). In this diagram, $C_i$ denotes a carry circuit of the i'th digit. In this adder, the symbol "i" has a value satisfying $1 \leq i \leq n-1$.

FIG. 6(A) represents a circuit of the i'th digit for generating an effective negative carry signal. In this diagram, $(\sim Z'_{i-1})_{eff}$ denotes an effective negative carry signal from the i−1'th digit. It is by this circuit that the signal $(\sim Z'_i)_{eff}$ in the i'th digit is obtained.

The function of this circuit is based on the operating principle of circuit B of FIG. 4. FIG. 6(B) is a schematic diagram indicating the circuit of FIG. 6(A). In this diagram, $\bar{C}_i$ is the symbol for the circuit which serves to generate an effective negative carry signal in the i'th digit. FIG. 7(A) represents a circuit for realizing, with a high electric field domain device, a circuit for carrying out a sum operation in the i'th digit of the adder. This circuit uses the effective carry signal $(Z'_{i-1})_{eff}$ from the i−1'th digit and the corresponding effective negative carry signal $(\sim Z'_{i-1})_{eff}$ and has a configuration based on the operating principle of FIG. 3. In the diagram, the signal $(Z'_{i-1})_{eff}$ is applied to the trigger electrode of the element disposed to the left of the high electric field domain device for carrying out the exclusive-or operation. In this case, since the signal $x_i \oplus y_i$ has been applied in advance to the suppressing electrode of the element, a signal for performing the operation $(Z'_{i-1})_{eff} \cdot \sim(x_i \oplus y_i)$ is derived from the output electrode of the element. By the same token, an output signal for performing the operation $(\sim Z'_{i-1})_{eff}(x_i \oplus y_i)$ is derived in the right hand element.

For the purpose of effecting the logical sum on these two output signals, the output electrodes are connected with a conductor. Consequently, the sum signal $Z_i$ of the formula (4) is obtained. Although $Z_i$ is an effective affirmative signal, it may be retained as information, as occasion demands by having the signal committed to storage in a memory circuit. FIG. 7(B) is a schematic diagram indicating the circuit for performing the operation described above. In this diagram, the exclusive-or circuit in the i'th digit is denoted by the symbol $S_i$.

Figure 8:
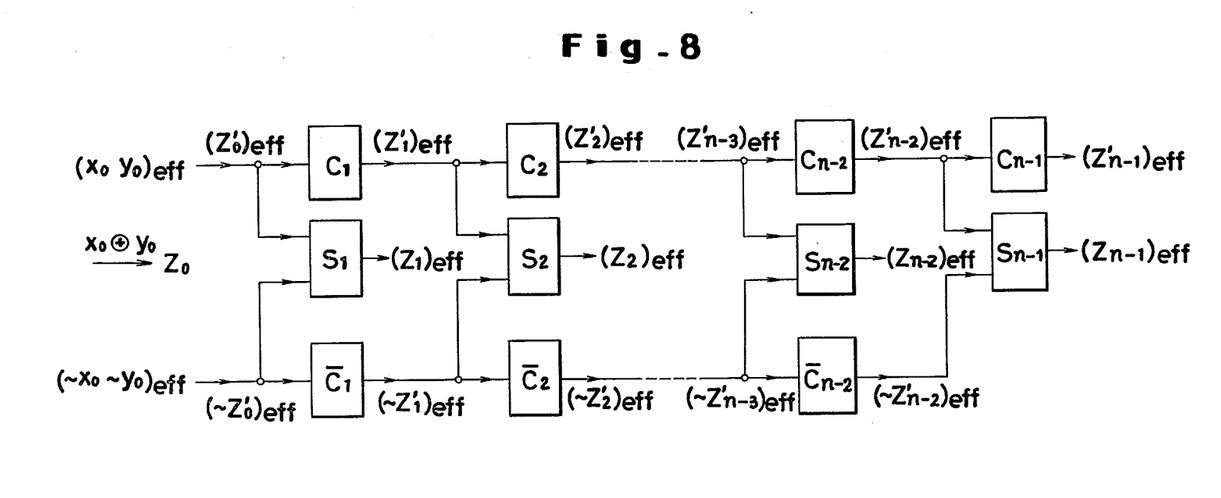
FIG. 8 is a block diagram illustrating one embodiment of the adder circuit formed of the circuits illustrated in FIG. 5 through FIG. 7.

FIG. 8 represents one embodiment of the adder circuit involving n digits from 0 bit to n-1 bit, which is formed by using the exclusive-or circuit system and the two (one regular and one auxiliary) mutually negating lines of unidirectional high-speed carry circuits.

In the diagram, it is seen that the circuits illustrated in FIGS. 5–7 are used as component circuits of the adder. The results of the logical sum operations performed in the respective digits are obtained in the form of signals $Z_0, (Z_1)_{eff}, \ldots (Z_{n-1})_{eff}, (Z'_{n-1})_{eff}$. Specifically, $Z_0$ is obtained as the signal for $x_0 \oplus y_0$. Thus, there can be materialized an adder which is free from erroneous operation and enjoys high reliability.

With the conventional logic operation circuits utilizing the phenomenon of high electric field, the outstanding disadvantage is in their failure to perform the exclusive-or operations. It has been substantially impossible for the conventional circuits to perform multi-bit logic operations with exactness.

In sharp contrast, in the exclusive-or circuit system according to the present invention, the configuration is simple and the means or wiring for applying signals to the component elements is notably simplified. The logical sum operations can be carried out by this system at an extremely high speed with high reliability of performance by adoption of two (one regular and one auxiliary) lines of unidirectional carry signal circuits capable of generating effective affirmative and negative signals. Thus, the present invention is greatly effective in heightening the operating speed of the electronic data processing systems.

In summary, the present invention is directed to a system of an extremely simple configuration capable of performing binary parallel sum operations with high reliability at a high speed without any operational error, by virtue of the fact that the phenomenon of generation and extinction of a high electric field domain in the high electric field domain device is controlled by using the signals of affirmation and the corresponding signals of negation all in the form of pulse-coded electric signals. This invention, accordingly, makes an outstanding contribution to reducing the dimensions, increasing the operational speed and enhancing the reliability of electronic data processing systems.

What is claimed is:

1. A method for exclusive-or operation by use of a high electric field domain device, said device comprising first and second high electric field domain circuit elements each having a portion of high electric field and a portion of low electric field, said portion of high electric field having attached thereto a high electric field domain-generating electrode for causing a domain to be generated by applying signal voltage thereto, said portion of low electric field having attached thereto a high electric field domain-suppressing electrode for causing a domain to be suppressed by applying signal voltage thereto and an output electrode, which method comprises:

applying a signal of affirmation (y) of a first signal (y) to said domain-suppressing electrode of said first circuit element and a signal of negation ($\sim$y) of the first siganl (y) to said domain-suppressing electrode of said second circuit element;

then applying an effective signal $(x)_{eff}$ of a signal of affirmation (x) of a second signal (x) to said domain-generating electrode and an effective signal $(\sim x)_{eff}$ of a signal of negation ($\sim$x) of the second signal (x) to said domain-generating electrode; and detecting the presence of high electric field domains generated in said first and second circuit elements for thereby obtaining the exclusive-or of said first and second signals (y, x).

2. A method for logic operation by use of a logic circuit device comprising a plurality of high electric field domain circuit elements each having a portion of high electric field and a portion of low electric field, said portion of high electric field having attached thereto a high electric field domain-suppressing electrode for causing a domain to be generated by applying signal voltage thereto, said portion of low electric field having attached thereto a high electric field domain-suppressing electrode for causing a domain to be suppressed by applying signal voltage thereto and an output electrode electrically connected with the domain-generating electrode of a succeeding one of said circuit elements, the output signal from said output electrode due to the generation of domain being applied to the domain-generating electrode of a succeeding one of said circuit elements, which method comprises:

applying a signal of negation $\sim(x_1 + y_1)$ of the exclusive-or of two binary numerals $(x_1, y_1)$ to the domain-suppressing electrode of one of said circuit elements;

then applying to the domain-generating electrode of said circuit element an effective signal $(Z'_0)_{eff}$ of the logical sum of an effective output signal from the preceding circuit element (namely, the output signal from the output electrode of the preceding circuit element) and an effective signal $(x_0 \cdot y_0)_{eff}$ of the logical product of two binary numerals of the preceding circuit element; and applying an effective signal $(Z'_1)_{eff}$ of the logical sum of the output signal from the output electrode of the circuit element and an effective signal $(x_1 \cdot y_1)_{eff}$ of the logical product of the two binary numerals applied to the circuit element, to the domain-generating electrode of a succeeding circuit element to which domain-generating electrode a signal of negation $\sim(x_2 + y_2)$ of the exclusive-or of two binary numerals $(x_2, y_2)$ applied to the domain-suppressing electrode of said circuit element is applied.

3. A method for adder operation by use of a pair of opposed logic circuit devices each comprising a plurality of high electric field domain circuit elements and of exclusive-or circuits each disposed between the opposed high electric field domain circuit elements and each composed of first and second circuit elements, each of said circuit elements having a portion of high electric field and a portion of low electric field, said portion of high electric field having attached thereto a high electric field domain-generating electrode for causing a domain to be generated by applying signal voltage thereto, said portion of low electric field having attached thereto a high electric field domain-suppressing electrode for causing a domain to be suppressed by applying signal voltage thereto and an output electrode electrically connected with the domain-generating electrode of a succeeding one of said circuit elements, the output signal from said output electrode due to the generation of domain being applied to the domain-generating electrode of a succeeding one of said high electric field domain circuit elements, which method comprises:

applying a signal of negation $\sim(x_1 + y_1)$ of the exclusive-or of two binary numerals $(x_1, y_1)$ to the domain-suppressing electrode of one of said high electric field domain circuit elements of one said logic circuit devices;

applying a signal of negation $\sim(x_1 + y_1)$ of the exclusive-or of two binary numerals $(x_1, y_1)$ to the domain-suppressing electrode of one ($\overline{C}_1$) of said high electric field domain circuit elements of the other logic circuit device;

applying to the domain-generating electrode of said circuit element ($C_1$) an effective siganl $(Z'_0)_{eff}$ of the logical sum of the effective output signal from the preceding circuit element and the effective signal $(x_0 \cdot y_0)_{eff}$ of the logical product of the two binary numerals applied to the circuit element ($C_1$);

applying to the domain-generating electrode of said circuit element ($\overline{C}_1$) an effective signal of negation $(\sim Z'_0)_{eff}$ of the logical sum of the effective output signal from the preceding circuit element and the effective signal of negation $(\sim x_0 \cdot \sim y_0)_{eff}$ of the logical product of the two binary numerals applied to the circuit element ($\overline{C}_1$);

applying an effective signal $(Z'_1)_{eff}$ of the logical sum of the output signal from the output electrode of said circuit element ($C_1$) and an effective signal $(x_1 \cdot y_1)_{eff}$ of the logical product of the two binary numerals applied to said circuit element ($C_1$), to the domain-generating electrode of a succeeding circuit element ($C_2$) to which electrode a signal of negation $\sim(x_2 + y_2)$ of the exclusive-or of the two binary numerals $(x_2, y_2)$ applied to the domain-suppressing electrode of said circuit element ($C_2$) is applied;

applying an effective signal of negation $(\sim Z'_1)_{eff}$ of the logical sum of the output signal from the output electrode of said circuit element ($\overline{C}_1$) and an effective signal $(\sim x_1 \cdot y_1)_{eff}$ of the logical product of the two binary numerals applied to said circuit element ($\overline{C}_1$), to the domain-generating electrode of a succeeding circuit element ($\overline{C}_2$) to which electrode a signal of negation $\sim(x_2 + y_2)$ of the exclusive-or of the two binary numerals $(x_2, y_2)$ applied to the domain-suppressing electrode of said circuit element ($\overline{C}_2$) is applied;

causing the circuit elements of one of said pair of opposed logic circuit device and those of the other logic circuit device to have opposite functions;

applying effective signals $((Z'_0)_{eff}, (Z'_1)_{eff} \ldots)$ of affirmation applied to the domain-generating electrodes of the circuit elements of one of said pair of opposed logic circuit devices, to the domain-generating electrodes of the first circuit elements of the exclusive-or circuits;

applying effective signals $((\sim Z'_0)_{eff}, (\sim Z'_1)_{eff} \ldots)$ of negation applied to the domain-generating electrodes of the circuit elements of the other logic circuit device, to the domain-generating electrodes of the second circuit elements of the exclusive-or circuits; and obtaining output signals from the output electrodes of the exclusive-or circuits as effective answer signals.

* * * * *